United States Patent [19]

Arques

[11] Patent Number: 4,957,659

[45] Date of Patent: Sep. 18, 1990

[54] PHOTOSENSITIVE MATRIX WITH THREE DIODES PER DOT WITHOUT OPTICAL RESETTING

[75] Inventor: MarcBerger Arques, both of Grenoble, France

[73] Assignee: Thomson-CSF, Paris, France

[21] Appl. No.: 295,555

[22] Filed: Jan. 11, 1989

[30] Foreign Application Priority Data

Jan. 15, 1988 [FR] France .................................. 8800412

[51] Int. Cl.[5] ............................................ H01J 40/14
[52] U.S. Cl. .............................. 250/208.1; 358/213.22
[58] Field of Search ................ 250/578, 211 J, 208.1; 357/24 LR, 30 H, 19; 358/209, 213.12, 213.13, 213.14, 213.22, 213.23, 213.26, 212

[56] References Cited

U.S. PATENT DOCUMENTS

| | | | |
|---|---|---|---|
| 3,935,446 | 1/1976 | Michon | 250/578 |
| 4,117,514 | 9/1978 | Terui et al. | 250/211 J |
| 4,281,254 | 7/1981 | Seachman | 250/578 |
| 4,382,187 | 5/1983 | Fraleux et al. | 358/213 |
| 4,695,715 | 9/1987 | Malm | 250/211 J |

FOREIGN PATENT DOCUMENTS 46396  2/1982  European Pat. Off. .

Primary Examiner—David C. Nelms
Attorney, Agent, or Firm—Oblon, Spivak, McClelland, Maier & Neustadt

[57] ABSTRACT

The disclosure concerns matrices of photosensitive elements. To avoid the need for a resetting light source using, as a photosensitive dot, a photodiode in series with a capacitor between a row conductor and a column conductor, it is proposed, according to the invention, to provide for a photosensitive dot comprising three diodes (a photosensitive diode, a reading diode and a resetting diode) connected to a common floating node. In one embodiment, the anode of the photosensitive diode is connected to a row-addressing conductor giving a reading pulse to the selected line; the cathode of the reading diode is connected to the column conductor which collects the useful signal; and the anode of the resetting diode is connected to a second row conductor (which, besides, may be the first conductor of a neighbouring row) which receives a resetting pulse after the reading pulse. In another embodiment, the photosensitive diode is turned back, its cathode being then connected to a row conductor; the resetting diode is simply connected to a reference voltage source.

13 Claims, 8 Drawing Sheets

PHOTOSENSITIVE MATRIX WITH THREE DIODES PER DOT WITHOUT OPTICAL RESETTING

BACKGROUND OF THE INVENTION

1. Field of the Invention

The invention concerns matrices of photosensitive elements.

The standard way to make matrices of photosensitive elements is to provide for a network of conductors in rows and a network of conductors in columns with a respective photosensitive element at each intersection of a row and a column. Through the network of rows, a row of photosensitive elements is selected, for which it is desired to know the electrical output signals. Through the network of column conductors, a respective output signal is read for each of the elements of the selected row.

2. Description of the Prior Art

The French patent application No. 86 00716 describes a photosensitive matrix having a network of photosensitive dots wherein each photosensitive dot has a charge storage capacitor in series with a photosensitive element, this unit being connected between a row conductor and a column conductor. The photosensitive element may be an PIN photodiode with three layers (a P type semiconducting layer, an intrinsic layer I and an N type layer).

Charges are generated in the photodiode by the illumination of the photosensitive dot. These charges get accumulated at the (floating) node between the photodiode and the capacitor. They are read by the application, to the row conductor, of a voltage pulse in one direction which gives the photodiode a forward bias (whereas it was reverse biased during the accumulation stage). Charges, of a quantity corresponding to the accumulated charges, are then transferred from the floating node to the column (or conversely from the column to the floating node). The reading operation consists in measuring this movement of charges.

After the end of the reading pulse, the photodiode turns off for a new stage of illumination and integration of charges.

But the potential of the floating node no longer has the value that it had at the start of the integration stage. It is therefore not possible to begin a new integration stage without setting up this potential of the floating node at a well-determined starting value.

The reading stage is therefore followed by a stage for resetting the potential of the floating node.

The resetting is done by intense illumination of the photodiode. It is therefore necessary to provide for a source of intense illumination and for control means synchronized with the photosensitive matrice reading means, in order to perform a resetting operation after each reading stage.

Furthermore, the above-described matrices, in which a unit in series with a photodiode and a capacitor is used as a photosensitive dot, require that illumination should be discontinuous, namely, that the matrix should be in darkness during the time reserved for the reading of the signal given by the photosensitive dots.

The present invention proposes a new photosensitive dot structure which removes the need for a source of illumination for resetting, and which enables the acquisition of information in a continuous flow without its being necessary to place the matrix in darkness during the reading stage.

SUMMARY OF THE INVENTION

According to the invention, there is proposed a matrix of photosensitive dots comprising a network of photosensitive dots arranged in rows (at least one row) and columns (at least one column), each photosensitive dot being located at the intersection of a row and a column, wherein each photosensitive dot comprises three diodes connected to a floating node, a first diode called a photosensitive diode being connected between a row conductor and the floating node to generate, when it is illuminated, electrical charges at the floating node, a second diode called a reading diode, connected between the floating node and a column conductor to enable the transfer, between this column conductor and the floating node, of a quantity of charges generated by the illumination, and a third diode, called a resetting diode, connected between the floating node and a conductor connected to a resetting voltage source, to reset the potential of the floating node at a chosen value after said charge transfer.

In a particular embodiment, the resetting source is a potential source with a fixed reference.

In this case, it is preferably provided that the anode of the photosensitive diode, the anode of the reading diode and the cathode of the resetting diode will be connected to the floating node or, conversely, that the cathode of the photosensitive diode, the cathode of the reading diode and the anode of the resetting diode will be connected to the floating node.

In this embodiment, not only is there no need for any source of light to reset the potential of the floating node, but there is not even any need to generate a specific resetting signal; the mere presence of the fixed voltage source is enough to reset the floating potential at the desired level.

In another embodiment, the source of resetting voltage is connected to another row conductor; a means is provided to apply a reading pulse to the row conductor connected to the photosensitive diode, at the end of a period of integration of charges. Another means is provided to apply a resetting voltage pulse to the other row conductor, after the reading pulse.

In this case, it is preferably provided that the cathode of the photosensitive diode, the anode of the reading diode and the cathode of the resetting diode will be connected to the floating node or, conversely, that the anode of the photosensitive diode, the cathode of the reading diode and the anode of the resetting diode will be connected to the floating node.

The advantage of this arrangement is that the lower the level of illumination, the greater will be the charge read on a column. This arrangement also has the advantage of enabling the transfer of a non-null minimum charge in all cases of illumination (from null illumination to saturation illumination).

It can then also be provided that the other row conductor mentioned is the row conductor connected to a photosensitive diode of a photosensitive dot corresponding to another row of photosensitive dots of the matrix. In certain cases, this other row will be adjacent to the first row, but cases can also be envisaged where it is not adjacent, particularly when it is sought to be able to read the matrix with an interlaced scanning of the rows. These embodiments make it possible to have two row conductors for each dot of the matrix.

In another embodiment, it is provided that the resetting conductor will be connected to a constant voltage source, which is the same for all the photosensitive points, and that there is applied, to the row conductor, a periodic signal with three different voltage levels which are, respectively, a first level during an integration stage, a second level during a reading stage and a third level during a resetting stage. This arrangement makes it possible both to avoid the presence of a second row conductor for each row of photosensitive dots and to provide a quantity of electrical charges which is all the greater as the illumination is low. In this case, it is preferably provided that the cathode of the photosensitive diode, the anode of the reading diode, and the cathode of the resetting diode will be connected to the floating node and that, reciprocally, the anode of the photosensitive diode, the cathode of the reading diode and the anode of the resetting diode will be connected to the floating node.

Finally, in certain cases, the reading will be done by the application of one reading pulse to one row, with all the columns being at a reference potential; but, in other cases, it would be possible to apply, to one row, a reading pulse which has one sign with respect to the reference potential of the columns and, simultaneously, a reading pulse, which has an opposite sign, to a specified column conductor connected to the photosensitive dot for which it is sought to read the charges, the other column conductors being kept at the reference potential. This arrangement makes it easy to select a column of photosensitive dots.

The invention can be applied to all sorts of photsensitive matrices, including those which are used in radiology and which, therefore, comprise a scintillator (gadolinium oxide, cesium iodide etc.) to convert X-radiation (or gamma, neutronic or other radiation) into light radiation in the band of wavelengths to which the photodiodes are sensitive.

The invention is particularly suited to an embodiment wherein the photosensitive dots are made by the superimposition of amorphous silicon layers.

Among the advantages anticipated from the present invention (for these advantages are essential to the quality of the matrices made) we might mention:

- the low capacitance of the columns of photosensitive dots;
- the high reading speed;
- the efficient uncoupling between the photosensitive dots of neighbouring rows or columns;
- the reduction in stray noise when the reading is done; this stray noise could be generated in prior art systems through the fact that the photosensitive diode is made conductive with forward bias; here the photodiode remains, in principle, reverse biased, even during the reading.

BRIEF DESCRIPTION OF THE DRAWINGS

Other features and advantages of the invention will emerge from the following detailed description, made with reference to the appended drawings, wherein.

DESCRIPTION OF PREFERRED EMBODIMENTS

Figure 1:
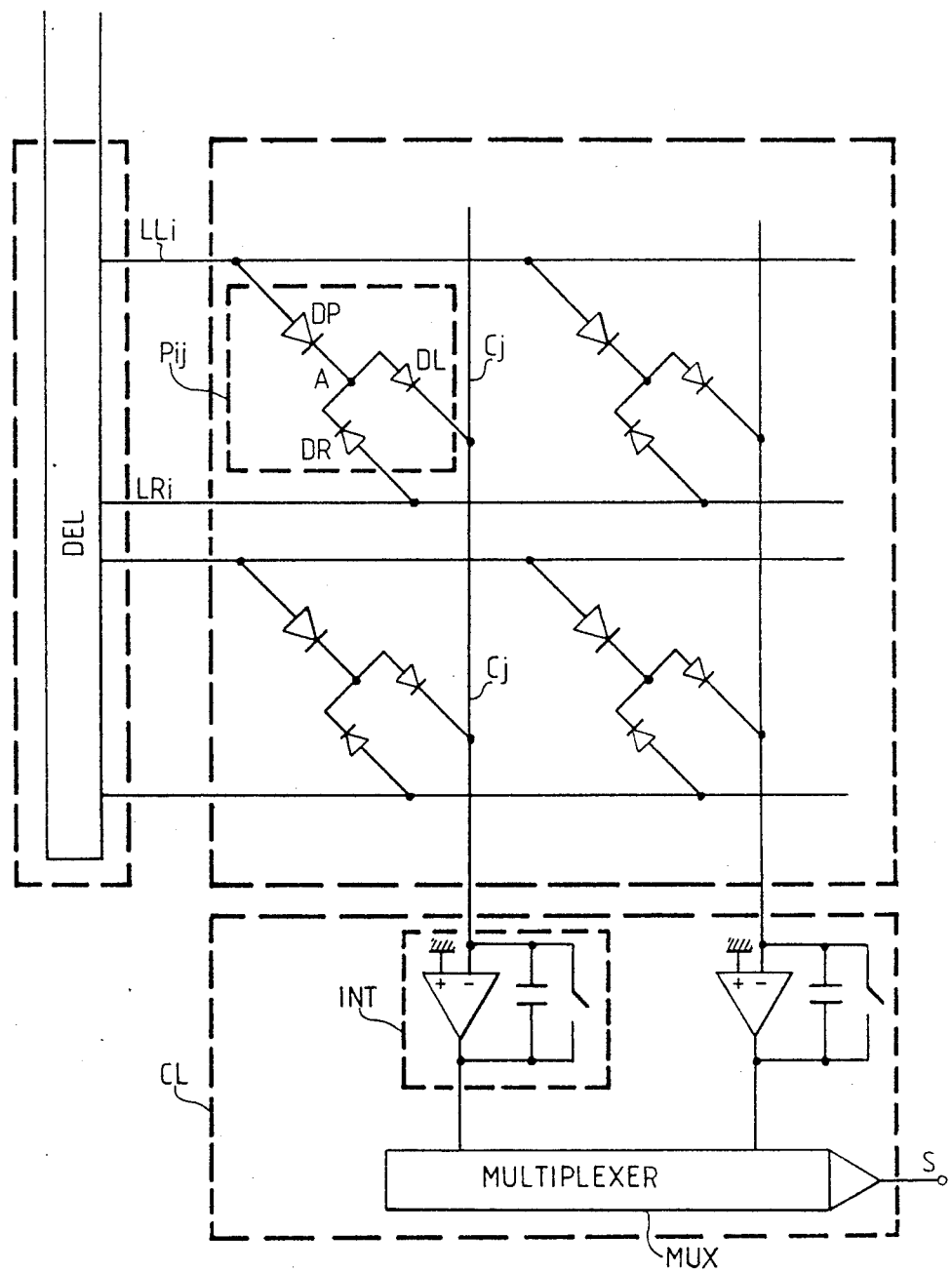
FIG. 1 shows a matrix of photosensitive dots according to the invention.

FIG. 1 shows a simplified diagram of a matrix of photosensitive dots according to an embodiment of the present invention.

The matrix comprises a network of rows and columns of photosensitive dots Pij.

Each row comprises, in fact, two row conductors LLi and LRi, to which the photosensitive dots of this row are connected. The row conductor LLi is used to give a voltage pulse for the reading of the dots of this row. The row conductor LRi is used to give a resetting pulse before a new stage of integration. The row conductors are connected to a row decoder DEL capable of selecting a determined row for which it is sought to read the dots. The row decoder DEL permits the transmission of reading and resetting pulses to the conductors LLi and LRi, respectively, of the selected row.

Each column has a column conductor Cj to which the photosensitive dots of this column are connected. The column conductor Cj is connected to a circuit CL for reading the charges generated by the photosensitive dot Pij located at the intersection between this column and the selected row.

In one embodiment, the reading circuit comprises an integrator INT for each of the columns of dots, and a multiplexer MUX receiving the outputs of the integrators to give, successively, at its output S, signals representing the illumination of the successive dots of the designated row.

In other cases, the reading circuit could be a charge transfer circuit, and the multiplexer could be a charge transfer shift register.

According to the invention, each photosensitive dot Pij comprises three diodes connected to a common floating node A and designated by:

DP (diode the main characteristic of which is that it is photosensitive);

DL (reading diode enabling the transfer of charges from the floating node A to the column conductor Cj);

DR (resetting diode enabling the resetting, at a determined level, of the potential of the node A after a reading operation).

In the embodiment of FIG. 1, the photosensitive diode DP is connected between the first row conductor LLi and the floating node A, the reading diode DL is connected between the column conductor and the floating node, and the resetting diode is connected between the second row conductor LRi and the floating node.

More precisely, in the example of FIG. 1, it is the cathode of the photosensitive diode DP, the anode of the reading diode DL and the cathode of the resetting diode that are connected to the floating node. However, in an equivalent way, and on condition that the relative directions of the potentials brought into play at the row and column conductors are reversed, it is possible to provide for a reversal of the anodes and cathodes of the three diodes. In this case, the anode of the photosensitive diode, the cathode of the reading diode and the anode of the resetting diode would be connected to the floating node.

The diode DP has a relatively large area so that its sensitivity is sufficient. The other two diodes are smaller and is preferably placed in darkness, especially the diode DL for, if it were illuminated, there would be the risk of its taking away charges from the useful signal stored at the floating node.

The capacitance of the column of dots will be all the smaller (which is advantageous) as the capacitance of the reading diode is small; this is an incentive to choosing a small-sized diode for DL.

WORKING OF THE DIAGRAM OF FIG. 1

To simplify the explanations, it shall be assumed that the capacitance of the diodes DL and DP is low as compared with that of the photosensitive diode DP. If this were not the case, the digital values of potentials and potential variations indicated during the explanations would be modified, but the operating principle would remain valid.

Drops in potential in the diodes shall also be overlooked when they are forward biased, although these drops are of the order of 0.5 volts.

Finally, it shall be assumed that the reading circuit connected to the columns keeps their potential at a null reference value.

Figure 2A:
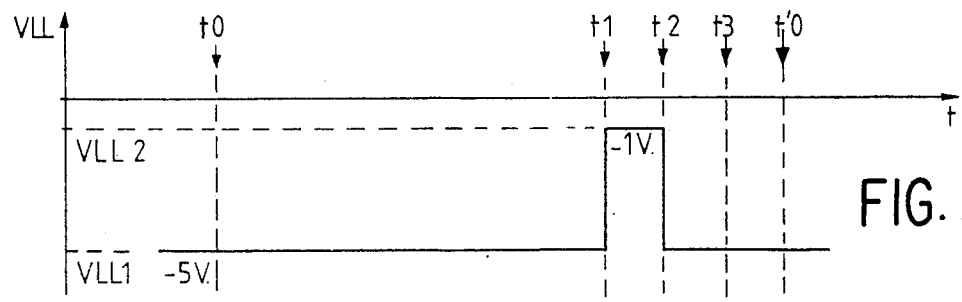
FIGS. 2a, 2b and 2c show the timing diagrams of variation in potentials, respectively in the first row conductor, the second row conductor and the common floating node, for the embodiment of FIG. 1.
Figure 2B:
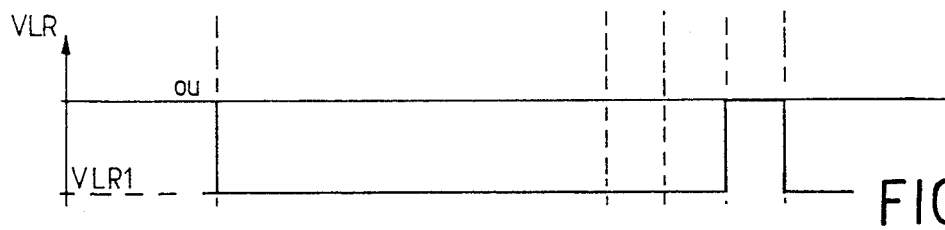

FIG. 2 shows timing diagrams which make it possible to illustrate the operation.

The periodic working cycle lasts between an instant tO and an instant t'O.

At the outset, just before the instant tO, the initial state is as follows (FIG. 2, diagram 2a, 2b, 2c):

the potential VLL at the first row conductor LLi has a negative value VLL1, for example −5 volts;

the potential VLR at the second row conductor Li has a null potential;

the potential VA at the node A has a null value.

It shall be seen that it is actually the situation that will exist at the end of the reading cycle which will now be described.

At the instant tO, a negative potential VLR1, preferably lower than VLL1 in terms of absolute value, is applied to the second row conductor LRi. This potential has, for example, a value of −3 volts.

Since the capacitance of the diode DP is very small compared with that of the diode DP, the potential of the node A undergoes almost no variation under the effect of this voltage switch-over (however, it varies negatively to an extent which is sufficient to turn off the reading diode DL).

From the instant tO up to the instant t1, the illuminated photodiode DP generates charges (electrons in this case) which collect at the node A, causing a drop in the potential of this node, in proportion to the illumination. The charges cannot be discharged through any of the diodes because they are all reverse biased (at least for as long as the potential of the node A does not fall below the potential of one of the two conductors LLi and LRi, namely below −3 volts in this case).

Figure 2C:
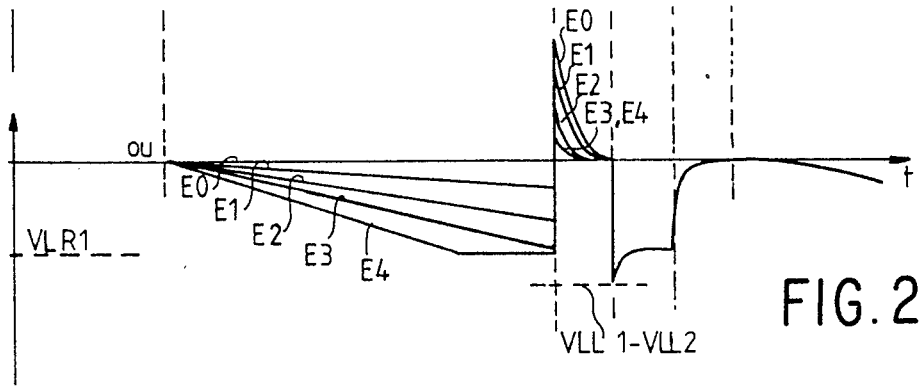

The diagram of FIG. 2c shows what happens for different levels of illumination:

level E0, zero illumination;
level E1, low illumination;
level E2, medium illumination;
level E3, maximum legible illumination;
level E4, excessive illumination: saturation The maximum illumination level E3 is a level of illumination such that, at the end of the charge integration period, at the instant t1, when the reading proper starts, the potential of the point A reaches the negative level VLR1 or the level VLL1 (in practice VLR1 since VLR1 is less negative than VLL1).

Beyond this illumination level E3, the resetting diode DP goes into forward bias and the potential of the node A can no longer fall (saturation). Besides it must be noted, in this respect, that the excess quantity of charges generated is discharged towards a row conductor where it would disturb the signal of the rows which could be in the process of being read. The anti-dazzle effect produced by the resetting diode thus has effect in a particularly useful way.

At the instant t1, which marks the end of the integration period, a reading pulse (FIG. 2a) is applied to the first row conductor LLi. This pulse makes the potential VLL of this conductor go suddenly from the largely negative value VLL1 to a value VLL2 which slightly negative (for example −1 volt). The potential of the floating node A then rises suddenly (diagram 2c) by a value corresponding to the increase in voltage VLL, i.e. by a value (VLL2−VLL1). This sudden rise takes place by capacitive coupling through the diode DP which is reverse biased and behaves like a capacitor.

If the amplitude (VLL2−VLL1) of the reading pulse is made to be greater than the absolute value of the voltage VLR1 applied to the second row conductor, it is seen that the potential of the node A will become always positive at the instant t1, irrespectively of the level of illumination during the interval tO, t1 (diagram 2c).

The reading diode then becomes systematically conductive since the potential of the column conductor is equal to zero. Consequently, the charges stored at the floating node get discharged through the reading diode towards the column conductor and generate a signal in the reading circuit CL.

As this discharging process goes ahead, the potential of the floating node A falls and returns to zero. This fall is quick and should be completed at the end of the reading pulse, namely at the instant t2. The diagram 2c represents the return to zero of the potential of the node A as a function of the level of illumination which had been received by the photodiode DP.

At the instant t2, which marks the end of the reading pulse, the potential of the first row conductor returns to its starting value VLL1, causing a sudden drop in potential at the node A (which has again become a floating node since no diode is forward biased at this instant). This sudden drop in potential has an amplitude equal to VLL2-VLL1 (diagram 2c, instant t2).

The sudden drop in the potential of the node A from zero to a value VLL1-VLL2 makes the photodiode DR momentarily conductive. This brings the potential of the node A to the value VLR1 of the potential of the second row conductor LR1.

At the instant t3, there begins the stage for resetting the potential of the node A. This resetting is necessary to return to the starting conditions in which the potential of the node A was null.

The resetting is done by a resetting pulse applied to the second row conductor LRi, the potential VLR1 of which has not varied since the start of the cycle. The pulse is a positive pulse with an amplitude VLR1, i.e. it brings the potential of the row conductor to zero. This pulse starts at the instant t3. It ends at the instant t'0 at the outset of a new reading cycle.

It can be noted here that the resetting pulse can start before the end of the reading pulse, provided that it does not start before the potential of the point A has again gone from a positive value to zero and provided that it ends after the reading pulse.

The resetting pulse has the effect of bringing the potential of the node A to zero since the photodiode is then forward biased (diagram 2c). The potential of the node A then remains at zero until the end of the resetting pulse, namely until the instant t'0 when a new charge integration cycle begins.

Figure 3:
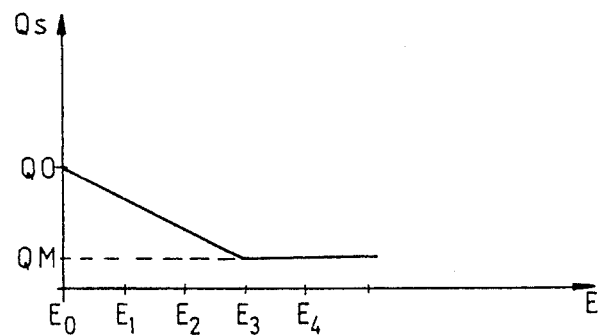
FIG. 3 shows a curve of variation in the quantity of charges read at the column, as a function of the illumination.

FIG. 3 shows a graph of the value of the charge collected at the column Cj during the reading pulse, as a function of the illumination received during the integration period t0, t1. This charge is proportionate to the integral of the variation of the potential of the point A during the reading pulse. The variation can be seen in the graph 2c of FIG. 2.

In FIG. 3, it can be seen that the useful signal Qs is linear for illumination varying between null illumination E0 and the maximum illumination E3; beyond this value, there is saturation and the charge read is independent of the illumination.

It is very useful to note, in this figure, that the charge read decreases with the illumination. It is at its maximum (QO) for null illumination. This is very important because it is generally for the low illumination levels that weak charges are collected which are more difficult to transfer (or to transfer quickly) than bigger charges. It is also important to note that, even for maximum illumination E3, the charge QM collected is not null once the potential difference VLL2-VLL1 is greater in terms of absolute value than VLR1. Consequently, there will never be a situation where a null charge has to be read.

The working of the charge integration cycle and the reading of these charges has thus been completely described for a row of the matrix. The different rows each successively receive a reading pulse followed by a resetting pulse, and these pulses are staggered in time, from one row to another, so that there is no situation where two rows are simultaneously addressed in reading/resetting.

It may be noted that the capacitance of the column is substantially equal to (or in any case not greater than) the sum of the capacitances of the reading diodes DL of the non-addressed rows. This capacitance is far smaller than what it was in the prior art (with a photosensitive dot using a photodiode in series with a capacitor) for the capacitance of the diode DL may be far smaller than that of the prior art photodiode and capacitor.

Finally, it may be noted that the photodiode DP remains reverse biased throughout the integration and reading cycle. This prevents premature ageing and prevents the introduction of a high level of noise during the reading.

ALTERNATIVE MODE OF OPERATION

Figure 4A:
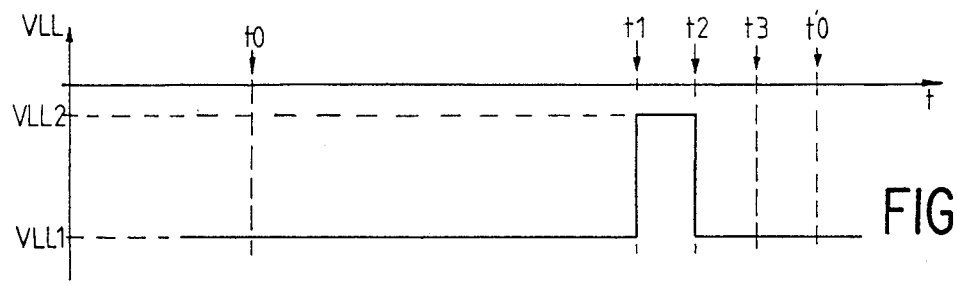
FIG. 4 shows timing diagrams of potentials for an alternative mode of operation of the circuit of FIG. 1.
Figure 4B:
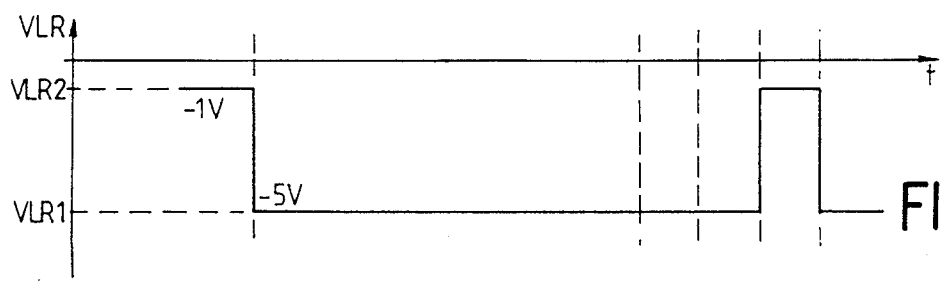
Figure 4C:
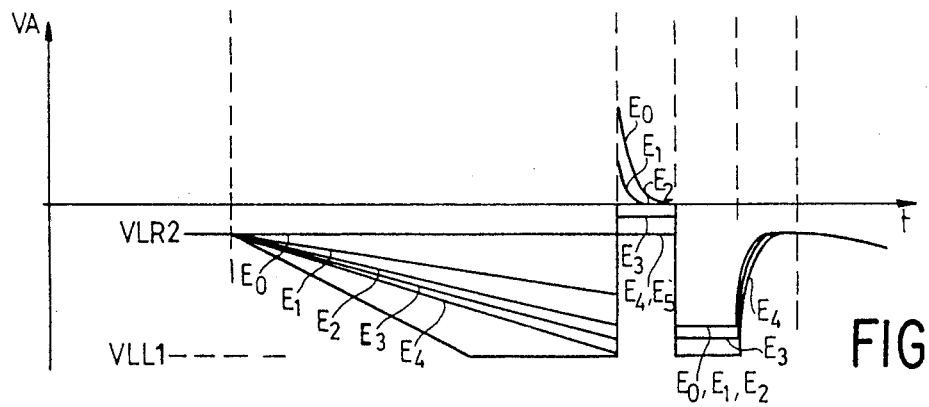

In one alternative embodiment, the potentials are modified in the manner shown in FIG. 4, i.e.

firstly, the most negative potential VLR1 of the second row conductor LRi is equal to the most negative potential VLL1 of the first row conductor LLi;

secondly, the most positive potential of the second conductor (during the resetting pulse) is no longer null but is equal to a value VLR2 which is slightly negative (as compared with the column potential), and is preferably equal to the high potential VLL2 of the reading pulse.

The result thereof is that the reading and resetting pulses have the same amplitude and, furthermore, they have the same high level and the same low level (see diagrams 4a and 4b of FIG. 4).

The diagram 4c of FIG. 4 shows the variations in potential of the node A, respectively for a null illumination level E0, a medium illumination level E1, a maximum measurable illumination level E2, a greater illumination level E3 and a high illumination level E4 for which an anti-dazzle function comes into play.

Unlike in the case of FIG. 2, the potential of the node A at the instant t0, when the integration/reading cycle starts, is not null but is equal to VLR2, a value to which it has been brought by the previous resetting pulse.

For the illumination levels, E0, E1 and E2, the operation is very similar to that explained with respect to FIGS. 1 to 3, except that, for the illumination E2, the charge transmitted to the column conductor Cj during the reading pulse is null. There is no longer any benefit derived from the minimum charge QM which can be seen in FIG. 3.

Beyond the illumination level E2, the reading pulse no longer makes the potential of the node A go above zero, and no charge can any longer flow over into the column Cj.

Hence, throughout the duration of the reading, the potential of the node A remains at the value which it had reached at the end of the integration period, increased by VLL2-VLL1.

Starting from an illumination level E4 corresponding to a negative potential equal to VLL1 on the node A, the anti-dazzle function comes into play, the charges produced in excess flow over into the row conductors.

The reading pulse consists in causing the potential of the node A to rise suddenly by a value VLL2-VLL1. This potential becomes greater than zero if the illumination is between E0 and E2, thus making the reading diode DL conductive and thus transferring charges from the node A to the column Cj.

The end of the reading pulse brings the potential of the node A to a value VLL1-VLLR2 if the illumination is normal (between E0 and E2) and to a value that is variable between VLL1 and VLL1-VLL2 for greater illumination values. In any case, this potential is brought to its starting value VLR2 by the application of the resetting pulse to the second row conductor.

The resetting pulse makes the photodiode conductive and brings the potential of the floating node to the potential value VLR2 present at the row conductor LR1 during this pulse.

The next integration cycle starts at the instant t'O marking the end of the resetting pulse.

Figure 5:
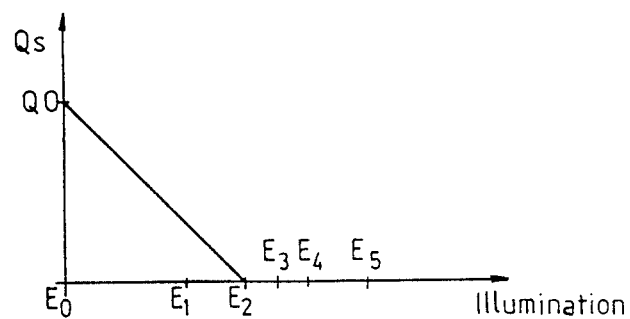
FIG. 5 shows the curve of variation of the quantity of charges read as a function of illumination, for the mode of operation of FIG. 4.

FIG. 5 shows the graph of the charge read on the column Cj, namely the integral of the variation in potential of the node A during the reading pulse, as a function of the illumination. The variation is linear, with a negative slope, and the charge read is maximum for null illumination. There is no longer any minimum charge read.

The choice of the potentials, VLL1, VLL2, VLR1, VLR2, which was made in the case of FIG. 3, is very particularly useful because the reading pulse is strictly identical to a resetting pulse with only a staggering in time between the two.

Figure 6:
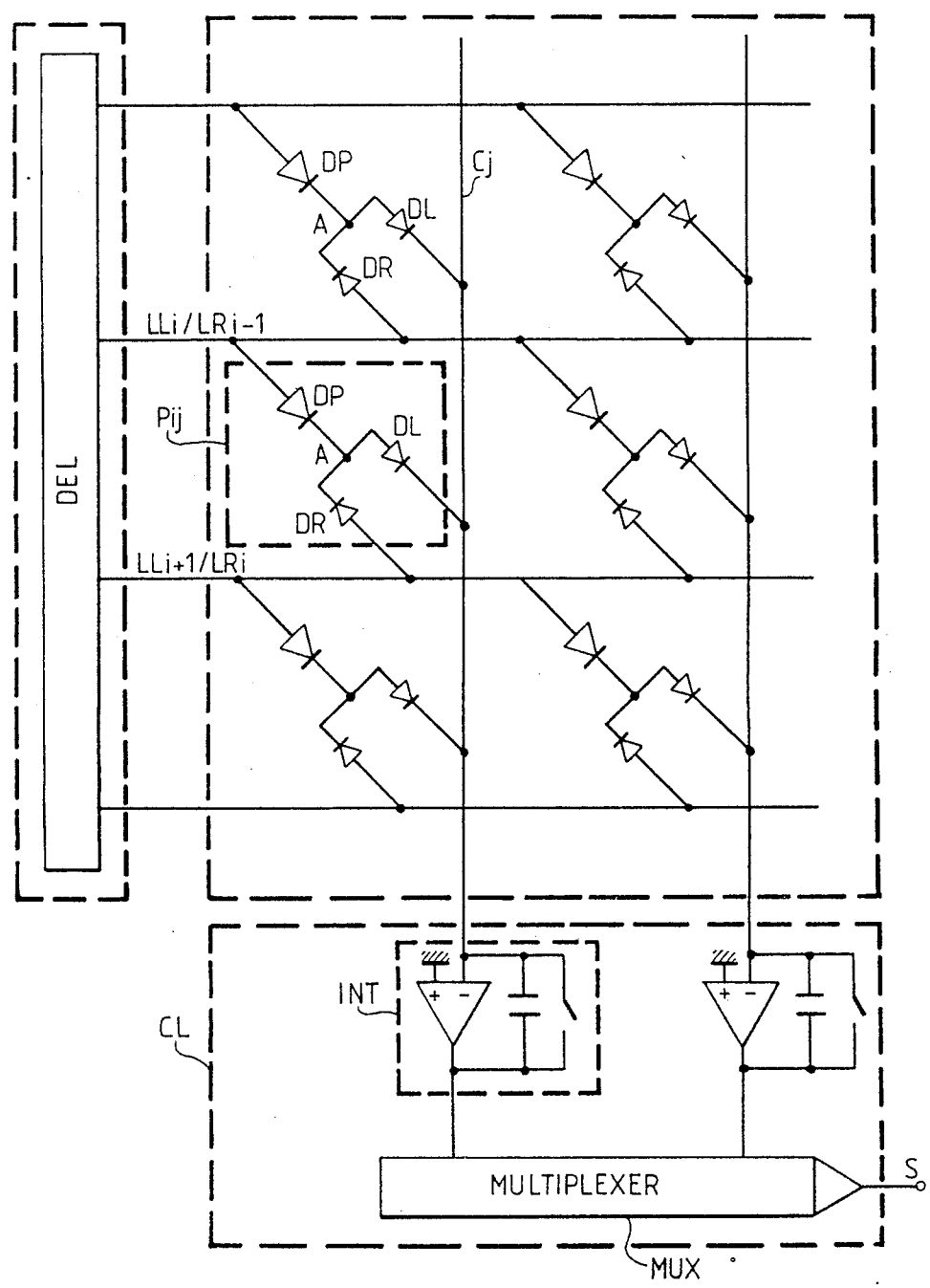
FIG. 6 shows an alternative embodiment using the mode of operation of FIG. 4.

FIG. 6 shows an embodiment which turns this special feature to advantage.

In FIG. 6, the second row conductor LR1 of the considered row and the first row conductor LLi+1 of the following row are grouped together in a single row conductor. The resetting pulse for the first row acts as a reading pulse for the following row, and so on.

The circuit works exactly according to the explanations given with reference to FIG. 3. Since the resetting pulse injects no charges into the column Cj but only to a row, there is no disadvantage in making this pulse act as a reading pulse for another row of dots.

The decoder DEL, which is used for the addressing of the rows, should apply a pulse fulfilling two roles, sequentially to each row.

In the drawing of FIG. 6, the row conductor Li is divided between two adjacent rows of photosensitive dots, and the pulses applied to the successive rows succeed one another in the order of the rows.

It may be noted that other approaches are possible wherein the row conductor coming from the row decoder DEL is divided between two non-adjacent rows in which case this conductor should be split into two (but it receives a single signal formed by a reading/resetting pulse). This arrangement is useful for matrices in which it is sought to make, firstly, a summation of the signals of several rows and, secondly, an interlaced scanning (the scanning of every other row in a first half frame and of the other rows in the second half frame). This arrangement can be used, for example, if it is sought to read groups of two adjacent rows at a time (in collecting the sum of the charges, corresponding to these two rows, at the column). And, besides, this reading of two or more adjacent rows at a time may be done in interlaced scanning: a group of two rows will be read, the second group will be skipped, the third group will be read, etc., during a first half frame; then the first group will be skipped, the second group will be read, the third group will be skipped, etc. during the second half frame. Then one row conductor will be used, divided between the first row and the fifth row, another row conductor divided between the second row and the sixth row, etc.

We shall now describe another, particularly worthwhile embodiment of the invention. This embodiment is describted with reference to FIG. 7.

Figure 7:
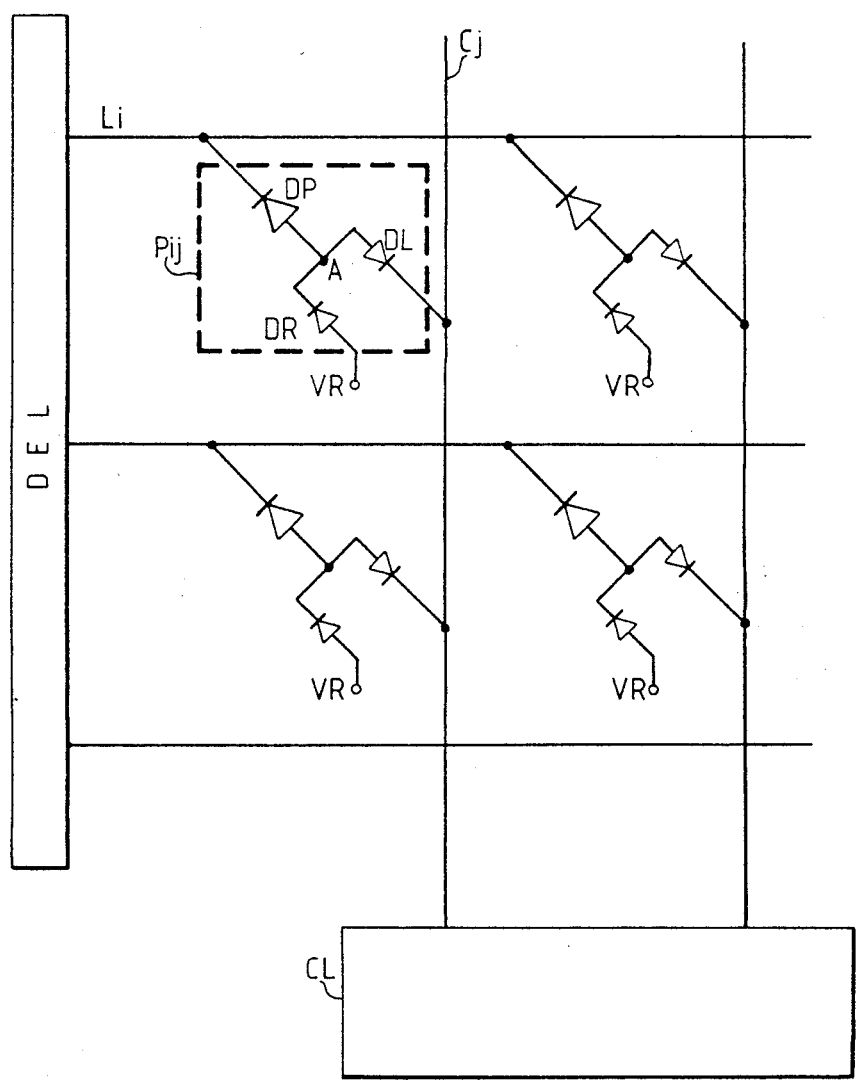
FIG. 7 shows another embodiment of the photosensitive matrix according to the invention, wherein the resetting after reading is done not by a voltage pulse but by a DC voltage source.

FIG. 7 is distinguished from FIG. 1 in two main points:

(1) The photosensitive diode DP is turned back with respect to the others; while the anode of the reading diode and the cathode of the resetting diode are still connected to the floating node A, as in the FIGS. 1 and 6, it is now the anode of the photodiode DP and no longer its cathode that is connected to the node A; conversely, if the cathode of the reading diode and the anode of the resetting diode are connected to the common node A, then the embodiment of FIG. 7 requires the cathode of the photosensitive diode DP to be connected to the common node A.

(2) The resetting voltage source is no longer a row conductor (LRi in FIG. 1) which transmits a resetting pulse periodically, to one row of photosensitive dots ast a time, after the reading pulse transmitted to the same row of photosensitive dots; but the resetting voltage source is quite simply a fixed voltage source VR and all the photosensitive dots are connected to the same voltage source.

The advantages to be derived from this arrangement can be seen, since there is no longer any need to address each row of photosensitive dots by two conductors such as LLi and LRi or to address each row by a single conductor (as in FIG. 6) but with limitations due to the fact that it is necessary to provide for exactly the same characteristics for the reading pulse and for the resetting pulse.

The structure of the photosensitive dot of FIG. 7 can thus be summarized very simply as three diodes connected to the common node A, with:

the cathode of the photosensitive diode DP connected to a row conductor Li, itself connected to an output of a row decorder; the decoder makes it possible to periodically give a reading pulse to a designated row of the matrix;

the cathode of the reading diode DL connected, as before, to the column conductor Cj at which it is sought to collect the signal generated by the photosensitive dot;

the anode of the resetting diode DR connected to a reference voltage source VR.

The reading diode DL and the resetting diode DR are preferably small and are, as far as possible, placed in darkness.

OPERATION OF THE DRAWING OF FIG. 7

In view if the small size of the diodes DL and DR as compared with that of the photosensitive diode DP, it shall be assumed, to simplify the explanation, that the capacitance values of these diodes are smaller than that of the diode DP. This means that any variation in voltage, applied suddenly to the row conductor Li, is immediately and practically integrally found again at the point A.

Figure 8A:
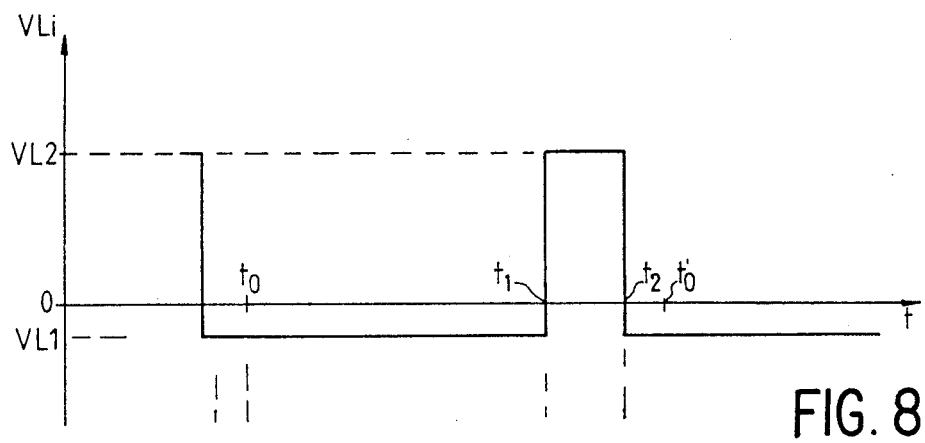
FIG. 8 is an explanatory timing diagram showing the variations in potential in the embodiment of FIG. 7.
Figure 8B:
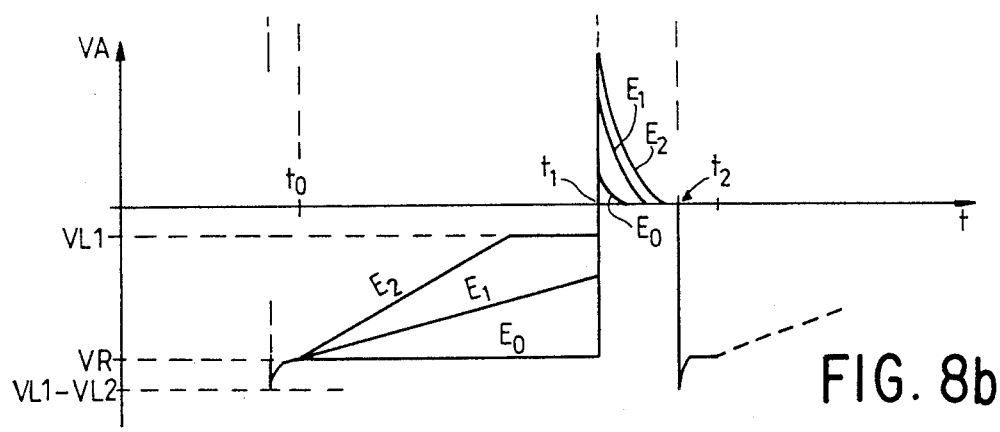

FIG. 8 shows a timing diagram of the variations in potential of the point A, firstly between a starting instant tO and an instant t'O marking the end of an integration/charge reading cycle. The charge integration period extends from the instant t0 to the instant t1 when a reading pulse is applied to the row conductor Li. The reading period last for the duration of the reading pulse, i.e. up to the instant t2. Between the instant t2 and the instant t'0, when a new cycle is started, a short resetting period elapses, but this resetting is automatic. It does not result from a control signal which should be generated between the instant t2 and the instant t'O as in the FIGS. 1 to 6.

It is assumed, at the outset, that the potential VA of the node A is equal to the reference voltage VR, that it is chosen to be as negative as possible with respect to the reference voltage zero (which is the voltage at which the column is maintained by the reading circuit);

for example, the voltage VR is −5 volts. It will be seen that it is really at this starting state VA=VR that there is a return to the end of the cycle.

Between the instants t0 and t1, the potential of the row conductor is maintained at a slightly negative value (for example −1 volts). Consequently, at the instant t0, the photosensitive diode DP is reverse biased, and so is the reading diode DL. The resetting diode has a null voltage at its terminals. The common node A is therefore insulated on all sides, and its potential is floating. The illumination of the photodiode generates charges (holes in this case) which get stored at this floating node and make the potential of the node A rise. The speed with which the potential rises varies according to the level of illumination. This rise in potential is shown in FIG. 8 in three cases of illumination, namely:

a null illumination E0 which causes no variation in the potential of the node A;

a medium illumination E1;

and an excessively high illumination E2 which saturates the photosensitive dot.

So long as the potential of the node A does not reach the weakly negative potential VL1 of the row conductor, all the diodes remain off and the potential of the node A may effectively increase in proportion to the illumination.

It is possible, however, that subsequently to an excessive illumination, the potential of the node A will reach the potential VL1 of the row conductor during the charge integration period, i.e. before the start of the reading pulse.

In this case, the photosensitive diode DP becomes conductive, the consequence of which is that:

(1) the potential of the node A stops increasing; it is therefore certain that, at the moment of the reading, a well-determined quantity of charges will be sent to the column, this quantity of charges corresponding to the saturation threshold of the device.

(2) the charges which continue to arrive subsequently to the illumination are directed towards the row conductor and not towards the column conductor where there is a risk that they might disturb the signal coming from another row which might be read at this moment.

At the instant t1, the reading pulse arrives at the row conductor Li. This reading pulse consists in making the potential of the row conductor go from its slightly negative value VL1 to a highly positive value VL2.

The voltage excursion VL2-VL1 may be 6 volts for example.

Since the photodiode is reverse biased, and since its capacitance is far greater than that of the other diodes, the sudden rise in voltage is immediately and entirely transmitted to the node A. This is also true if the device has been saturated because, then, the photodiode is forward biased and also enables the transmission of the increase in voltage.

The potential of the point A increases suddenly by a value VL2-VL1.

The voltage excursion VL2-VL1 is preferably chosen so that even in the event of null illumination (VA=VR at the instant t1), the potential of the point A becomes positive. In other words, it is preferably provided that VL2-VL1 is greater than the absolute value of the resetting voltage VR (taken with reference to the column reference voltage). This choice has the advantage of enabling the transmission of a non-null driving charge even for a null illumination, thus facilitating the reading of low illumination levels.

As soon as the voltage of the point A becomes positive, the reading diode becomes forward biased and the charges stored at the point A are discharged to the column conductor Cj which transmits them to the reading circuit CL.

FIG. 8 shows the variation of the potential of the node A during the reading pulse (t1 to t2) for the different levels of illumination envisaged (null, medium, saturation).

The reading pulse should have a duration which is sufficient to enable the discharge of all the charges stored at the node A, even in the case of null illumination.

At the end of the reading pulse, the reading diode is in the off state (null voltage at its terminals). The potential of the row conductor suddenly goes again to its slightly negative value VL1. The sudden reduction in voltage is integrally retransmitted to the node A which drops to a voltage VL1-VL2.

The resetting diode then goes into forward bias since it has been assumed that VL2-VL1 is greater than the reference voltage VR. The potential of the node A then rises to the value VR.

A new integration/reading cycle may start again at the instant t'0.

Figure 9:
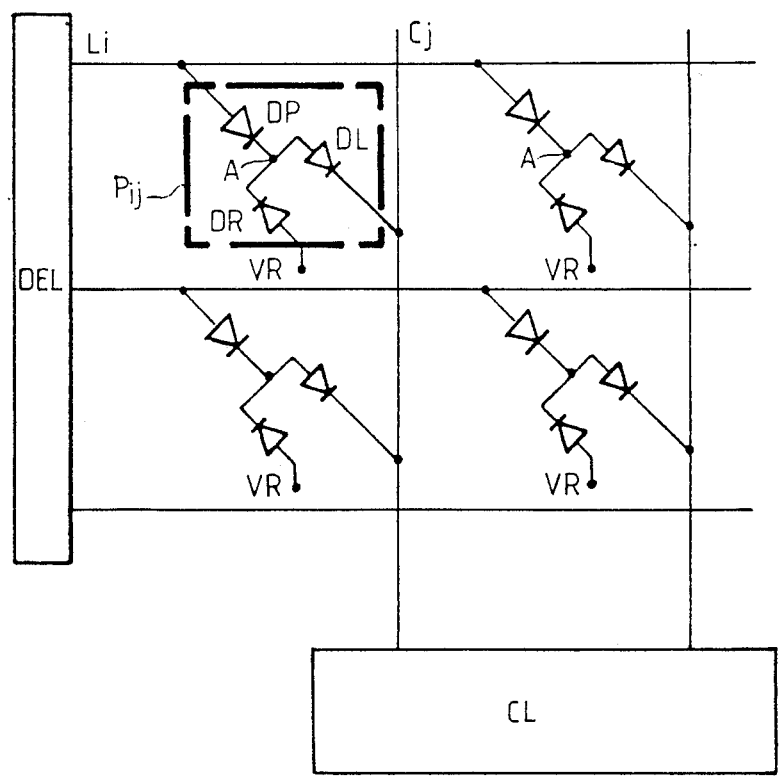
FIG. 9 shows another embodiment in which the resetting is done by a constant voltage source, but in a way which makes it possible to give a quantity of charges which is all the higher as the illumination level is low.

FIG. 9 shows another embodiment of the invention. The photosensitive dot is constituted exactly as described with reference to FIG. 1, but the resetting conductor (to which the resetting diode DR is connected) is no longer a conductor controlled by a row addressing device. On the contrary, as in FIG. 5, it is a conductor common to the entire photosensitive plane, and this conductor is permanently carried to a fixed potential VR.

The directions of the three diodes DP, DL, DR, could be all inverted simultaneously, provided that the directions of the potentials are also changed.

The structure of the photosensitive dot of FIG. 9 can thus be summarized very simply as three diodes connected to the common node A, with:

the anode of the photosensitive dot of FIG. 9 connected to a row conductor Li, itself connected to an output of a row decoder; the decoder makes it possible, as shall be seen, to periodically give a square wave signal, with three voltage levels, to a designated row of the matrix;

the anode of the reading diode DL is connected, as before, to the column conductor Cj at which it is sought to collect the signal generated by the photosensitive dot;

the cathode of the resetting diode DR is connected to a reference voltage source VR.

The reading diode DL and the resetting diode DR are, here again, preferably small and are, as far as possible, placed in darkness.

OPERATION OF THE DRAWING OF FIG. 9

In view of the small size of the diodes DL and DR, with respect to the photosensitive diode DP, it shall be assumed, to simplify the explanation, that the capacitance values of these diodes are smaller than that of the diode DP. This means that any variation in voltage, applied suddenly to the row conductor Li, is immediately and practically entirely found again at the point A.

Figure 10A:
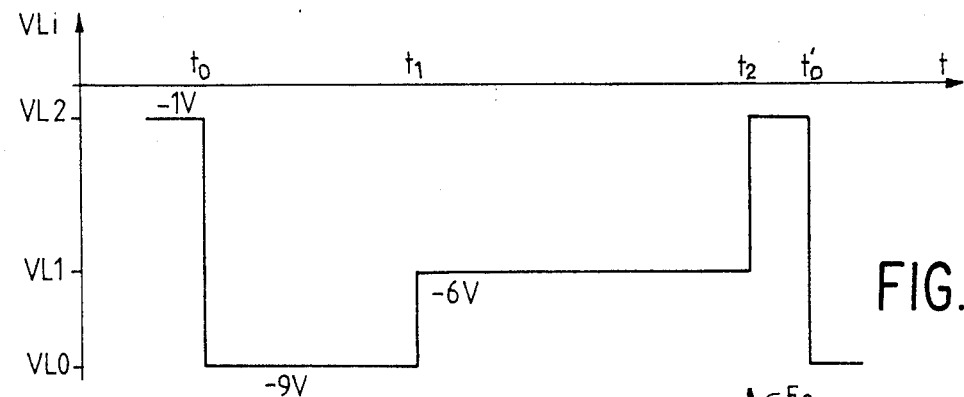
FIG. 10 is a timing diagram of the variations in voltage corresponding to the embodiment of FIG. 9.
Figure 10B:
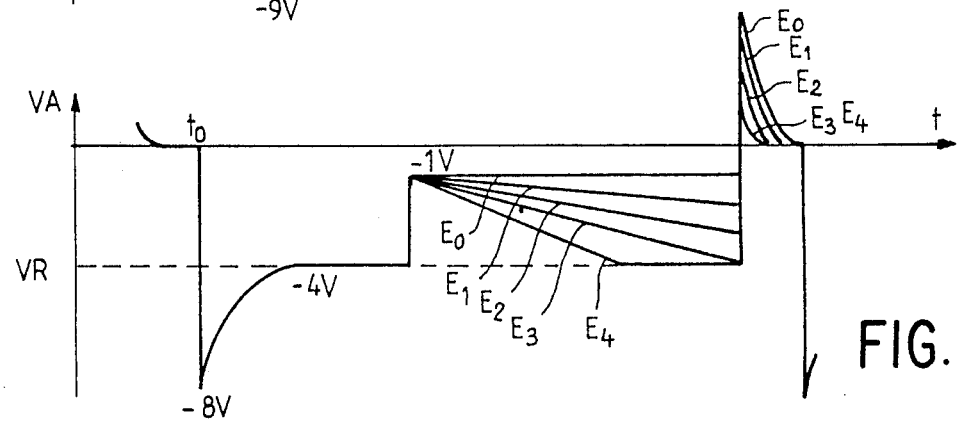

FIG. 10 shows a timing diagram of the variations in potential of the point A, firstly between a starting instant t0 and an instant t'0 marking the end of an integration/charge reading/resetting cycle.

The resetting voltage VR is negative, for the biases of the diodes represented, and assuming that the null potential reference is the potential of the column conductors. For example, VR = −4 volts.

The periodic operation cycle starts with a first resetting stage which goes from the instant t0 to the instant t1. During this stage, the potential applied to the row conductor Li has a first value VL0, for example −9 volts.

The second stage is a stage for the integration of charges during which the illuminated photodiode collects charges (in this case electrons) at the floating node. During this stage, from the instant t1 to the instant t2, the potential of the row conductor is carried to a value VLi which is appreciably greater than that of the voltage VR but is nevertheless negative. The difference VL1−VL0 will limit the range of measurement of the charges, and it is therefore necessary for this difference to be sufficient. For example, VL1 = −6 volts.

The third stage is a stage for reading the charges stored at the node A. For this stage, which lasts from the instant t2 to the instant t'O when a new cycle is started, the potential of the row conductor Li is taken to a third value VL2 which is still negative but which is as close as possible to zero. In practice, it is ppreferred such that the value VL2−VL1 should be greater than the absolute value of VR. Here we choose VL1 = −1 volt.

It is assumed at the outset that the potential VA of the node A is null. It will be seen that it is really at this starting state VA = 0 that there is a return to the end of the cycle.

At the instant t0, the potential of the row conductor Li falls suddenly from the value VL2 to the value VL0. The variation in potential is therefore VL0−VL2. The potential of the node A immediately falls by as much (through capacitive coupling) and the potential of the node A becomes equal to VL0−VL2.

But since this value is more negative than the resetting voltage VR, the diode DR becomes conductive and brings the potential of the node A to VR. This is the resetting stage.

At the instant t1, the potential of the row conductor Li rises by a value VL1−VL0. The potential of the node A increases to the same extent for, firstly, none of the diodes is forward biased and, secondly, the capacitance of the photodiode (through which the voltage pulse arrives) is far greater than that of the other diodes. The potential of the node A goes to the value VR+VL1−VL0, which, it has been stated, is negative. The charge integration stage then begins. The charges coming from the illumination collect at the node A and lower the potential of this node. There is saturation if the illumination is intense enough for the potential of the node A to fall to below VR. The resetting DR indeed prevents the potential from falling below VR.

At the instant t2 which marks the end of the stage of integration, the potential of the node A has a value ranging between:

VR+VL1−VL0 if the illumination is null (E0) and VR if the illumination is greater (E4) or equal (E3) to the saturation illumination.

The potential of the row conductor Li then goes to the value VL2. The variation in potential, with an amplitude VL2−VL1, is transmitted to the node A by capacitive coupling through the photodiode DP. The potential of the node A increases by a corresponding value in such a way that it becomes positive and makes the reading diode DL conductive. The charges stored at the point A are discharged to the column conductor Cj which transmits them to the reading circuit CL.

The voltage excursion VL2−VL1 is preferably chosen so that even in the event of null illumination (VA = VR+VL1−VL0 at the instant t2), the potential of the point A becomes positive. In other words, it is preferably provided that VL2−VL1 is greater than the absolute value of the resetting voltage VR (taken with reference to the column reference voltage). This choice has the advantage of enabling the transmission of a non-null driving charge even for a maximum illumination, thus facilitating the reading of high illumination levels. As for the reading of low illumination levels, it is very easy since, in this case, the charge to be transmitted to the column conductor is at its maximum.

The variation in the quantity of charges removed during the reading pulse (t2 to t'O) for the different levels of illumination envisaged (null, medium, saturation) is exactly the same as for FIG. 3.

The reading pulse should have a duration which is sufficient to enable the discharge of all the charges stored at the node A, even in the case of null illumination.

At the end of the reading pulse, the reading diode is in an off state (null voltage at its terminals). The potential of the row conductor suddenly goes again to its highly negative value VL0. The sudden reduction in voltage is integrally retransmitted to the node A which drops to a voltage VL0−VL2, and a new cycle starts.

Figure 11A:
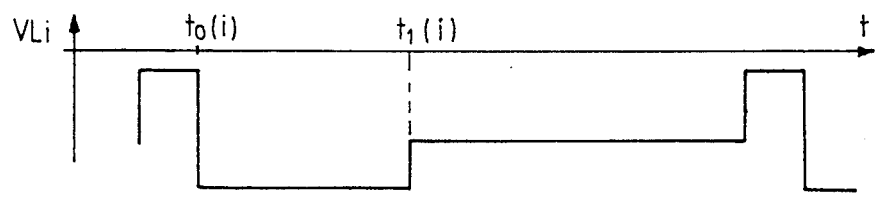
FIG. 11 is a timing diagram of the succession of control stages of the different rows of the matrix.
Figure 11B:
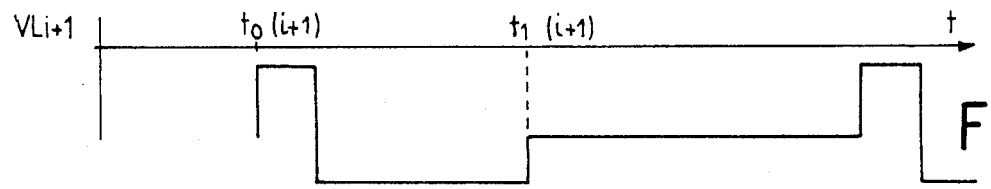
Figure 11C:
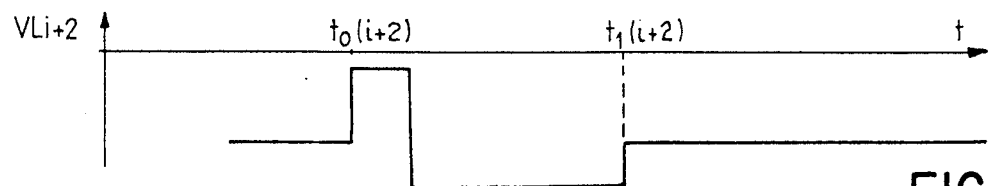

FIG. 11 shows how the resetting/integration/reading cycles should be staggered in time with respect to one another.

The reading pulses are staggered so that they do not mutually overlap one another. However, to start a reading pulse for a row, it is not necessary to wait for the resetting of the previous row to be completed.

What is claimed is:

1. A matrix of photosensitive dots comprising a network of photosensitive dots arranged in at least one row and in at least one column, each photosensitive dot being located at the intersection of a row and a column, wherein each photosensitive dot comprises three diodes connected to a common floating node, a first diode, being a photosensitive diode, connected between a row conductor and the floating node to generate, when it is illuminated, electrical charges at the floating node, a second diode, being a reading diode, connected between the floating node and a column conductor to enable a transfer, between this column conductor and the floating node, of a quantity of charges corresponding to the quantity of charges generated by the illumination, and a third diode, being a resetting diode, connected between the floating node and a conductor connected to a resetting voltage source, in order to reset the potential of the floating node at a chosen value after said charge transfer.

2. A photosensitive matrix according to claim 1, wherein the resetting voltage source is a fixed voltage source.

3. A matrix according to claim 2, wherein the anode of the photosensitive diode, the anode of the reading diode and the cathode of the resetting diode are connected to the common node or, conversely, the cathode of the photosensitive diode, the cathode of the reading diode and the anode of the resetting diode are connected to the common node.

4. A matrix according claim 2, wherein there is provided a means to apply, to the row conductor, a reading pulse with an amplitude which, in terms of absolute value, is greater than the absolute value of the difference in potential between the reference voltage source and a reference voltage at which the column conductor is maintained.

5. A matrix according to claim 1, wherein the cathode of the photosensitive diode, the anode of the reading diode, and the cathode of the resetting diode are connected to the floating node, or conversely, the anode of the photosensitive diode, the cathode of the reading diode and the anode of the resetting diode are connected to the floating node.

6. A matrix according to claim 5, wherein the resetting voltage source is connected to another row conductor and wherein a means is provided to apply, to the first row conductor mentioned, a reading pulse at the end of a charge integration period and, to the other row conductor, a resetting pulse following the reading pulse.

7. A matrix according to claim 6, wherein the reading pulse has a greater amplitude than the resetting pulse.

8. A matrix according to claim 6, wherein the reading pulse and the resetting pulse have the same amplitude and the same high and low potential levels.

9. A matrix according to claim 8, wherein the other row conductor, connected to the resetting diode of a photosensitive dot of a determined row, is the first row conductor connected to the photosensitive diode of a photosensitive dot of another row of the matrix.

10. A matrix according to claim 1, wherein there is provided a means to apply, to the row conductor, a reading voltage pulse of a first sign with respect to a reference potential applied to the column conductor during a charge integration stage and, simultaneously with the reading pulse, to apply a selection voltage pulse of the opposite sign to a specified column conductor connected to the photosensitive dot considered, the other column conductors being kept at the reference potential during this selection pulse.

11. A matrix according to claim 2, wherein the cathode of the photosensitive diode, the anode of the reading diode and the cathode of the resetting diode are connected to the common node or, reciprocally, the anode of the photosensitive diode, the cathode of the reading diode and the anode of the resetting diode are connected to the common node, and wherein there is provided a means to apply, to the row conductor, a potential variation cycle comprising a first charge integration stage in which the potential of the row conductor is at a first level, a second reading stage in which the potential of the row conductor is at a second level and a third resetting stage in which the potential of the row conductor is at a third level.

12. A matrix according to claim 11, wherein difference in potential between the first and third levels is smaller, in terms of absolute value, than the difference in potential between the resetting voltage source and a reference potential of the column conductors.

13. A matrix according to claim 12, wherein the difference in potential between the second and first levels is greater, in terms of absolute value, than the difference in potential between the resetting voltage source and a reference potential of the column conductors.

* * * * *

UNITED STATES PATENT AND TRADEMARK OFFICE
CERTIFICATE OF CORRECTION

PATENT NO. : 4,957,659
DATED : SEPTEMBER 18, 1990
INVENTOR(S) : MARC ARQUES ET AL.

It is certified that error appears in the above-identified patent and that said Letters Patent is hereby corrected as shown below:

On the title page item 75 delete "MarcBerger Arques" as the Inventor and insert --Marc Arques and Jean-Luc Berger--as the correct inventors.
　　　　Item [19] add --et al--.

Signed and Sealed this

Thirty-first Day of December, 1991

*Attest:*

HARRY F. MANBECK, JR.

*Attesting Officer*　　　　*Commissioner of Patents and Trademarks*